(12) United States Patent
Kim et al.

(10) Patent No.: US 8,406,432 B2
(45) Date of Patent: Mar. 26, 2013

(54) APPARATUS AND METHOD FOR AUTOMATIC GAIN CONTROL USING PHASE INFORMATION

(75) Inventors: Kyuhong Kim, Yongin-si (KR); Kwang Cheol Oh, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1043 days.

(21) Appl. No.: 12/218,063

(22) Filed: Jul. 11, 2008

(65) Prior Publication Data

US 2009/0232330 A1    Sep. 17, 2009

(30) Foreign Application Priority Data

Mar. 14, 2008  (KR) .......................... 10-2008-0024011

(51) Int. Cl.
*H03G 3/00* (2006.01)
(52) U.S. Cl. ........ 381/107; 381/106; 381/105; 381/104; 704/225; 704/226; 704/267

(58) Field of Classification Search .......... 381/104–107, 381/17; 704/225–226, 267; 700/94
See application file for complete search history.

(56) References Cited

U.S. PATENT DOCUMENTS

| | | | |
|---|---|---|---|
| 6,363,155 B1* | 3/2002 | Horbach | 381/17 |
| 2005/0010404 A1* | 1/2005 | Son et al. | 704/219 |
| 2007/0126553 A1* | 6/2007 | Park et al. | 340/10.1 |
| 2010/0280825 A1* | 11/2010 | Takano et al. | 704/225 |

* cited by examiner

*Primary Examiner* — Evan Pert
*Assistant Examiner* — Mark A Laurenzi
(74) *Attorney, Agent, or Firm* — Staas & Halsey LLP

(57) ABSTRACT

An apparatus and a method for automatically controlling a gain using phase information are provided. The apparatus includes a frequency conversion unit converting each of input signals received from a plurality of acoustic input apparatuses to frequency input signals, a factor determination unit determining a scaling factor according to a gain difference between the input signals based on a phase difference of the frequency input signals, and a scaling performance unit performing scaling for gain compensation between the input signals based on the scaling factor.

18 Claims, 8 Drawing Sheets

APPARATUS AND METHOD FOR AUTOMATIC GAIN CONTROL USING PHASE INFORMATION

CROSS-REFERENCE TO RELATED APPLICATIONS

This application claims the benefit of Korean Patent Application No. 10-2008-0024011, filed on Mar. 14, 2008, in the Korean Intellectual Property Office, the disclosure of which is incorporated herein by reference.

BACKGROUND

1. Field

Embodiments of the present invention relate to an apparatus and a method for automatically controlling a gain, and more particularly, to an apparatus and a method for automatically controlling a gain between acoustic input signals using phase information.

2. Description of the Related Art

With the popularization of mobile convergence terminals such as high-precision hearing aids of advanced medical devices, mobile phones, ultra mobile personal computers (UMPC), camcorders and the like, the need for application products using a microphone array are increasing. Most studies using the microphone array use a noise cancellation scheme based on a beamforming algorithm. Studies using microphone arrays have been conducted to find methods of improving voice call and recoding quality through the cancellation of directional noises, for use within a remote video conferencing system to automatically detect a speaker's location, and for use within robot technology to detect a target sound.

However, most beamforming algorithms may cause critical performance deterioration due to a gain difference between sensors. Specifically, in a Generalized Sidelobe Canceller (GSC) of a representative adaptive beamforming algorithm, target sound components are included in blocking signals due to a gain difference between signals, resulting in the occurrence of a phenomenon where a target sound is leaked into a resulting signal of an adaptive filter. Also, in the GSC, a shape of a beam is distorted due to a gain difference between microphones even when forming a basic beam so that a beam is not properly formed.

Generally, a gain difference between microphones occurs from characteristics of the microphones resulting from a fabrication defect or deterioration due to use over time. Methods for fabricating a microphone having fewer defects may solve the gain difference problem, however, the methods may not be optimal in view of reducing costs. Accordingly, a new algorithm which is less sensitive to the characteristics of microphones when using a microphone array of a lower price is required.

SUMMARY

According to an aspect of embodiments of the present invention, there is provided an apparatus for automatically controlling a gain using phase information including a frequency conversion unit converting each of input signals received from a plurality of acoustic input apparatuses to frequency input signals, a factor determination unit determining a scaling factor according to a gain difference between the input signals based on a phase difference of the frequency input signals, and a scaling performance unit performing scaling for gain compensation between the input signals based on the scaling factor.

The factor determination unit may include a phase difference calculation unit calculating a phase difference between the frequency input signals, a target signal determination unit determining frequency target signals corresponding to each of the input signals based on the phase difference, and a scaling factor determination unit determining a scaling factor according to a gain difference between the input signals based on the frequency target signals.

The target signal determination unit may includes an acoustic direction calculation unit calculating an acoustic direction for each frequency based on the phase difference, a predominant target sound component extraction unit extracting a predominant target sound component based on the acoustic direction for each frequency, and a determination unit determining frequency target signals corresponding to each of the input signals based on frequency input signals and the predominant target sound component.

The scaling factor determination unit may include a reference selection unit selecting a reference signal and a comparison signal from the input signals, and a ratio determination unit determining the amplitude ratio or the energy ratio between a frequency target signal corresponding to the reference signal and the frequency target signals corresponding to the comparison signal to be the scaling factor.

The scaling performance unit may include an average scaling factor determination unit determining an average scaling factor based on the scaling factor, and a time domain unit performing scaling for gain compensation between the input signals based on the comparison signal and the average scaling signal.

The scaling performance unit may include a frequency domain performance unit performing scaling for gain compensation between the input signals based on the frequency input signal being converted from the comparison signal and the scaling factor.

In an aspect of embodiments of the present invention, there is provided a method for automatically controlling a gain using phase information including converting each of a plurality of input signals received from a plurality of acoustic input apparatuses to frequency input signals, determining a scaling factor according to a gain difference between the input signals based on a phase difference of the frequency input signals, and performing scaling for gain compensation between the input signals based on the scaling factor.

According to an aspect of embodiments of the present invention, there are provided an apparatus and a method for automatically controlling a gain using phase information that extracts a predominant target sound component, thereby compensating for a gain difference between input signals based on the extracted predominant target sound component.

According to still another aspect of embodiments of the present invention, there are provided an apparatus and a method for automatically controlling a gain using phase information that determines a frequency target signal corresponding to input signals using phase information, thereby compensating for a gain difference even when noise exists.

Additional aspects, features, and/or advantages of the invention will be set forth in part in the description which follows and, in part, will be apparent from the description, or may be learned by practice of the invention.

BRIEF DESCRIPTION OF THE DRAWINGS

These and/or other aspects and advantages will become apparent and more readily appreciated from the following description of the embodiments, taken in conjunction with the accompanying drawings of which.

DETAILED DESCRIPTION OF EMBODIMENTS

Figure 1:
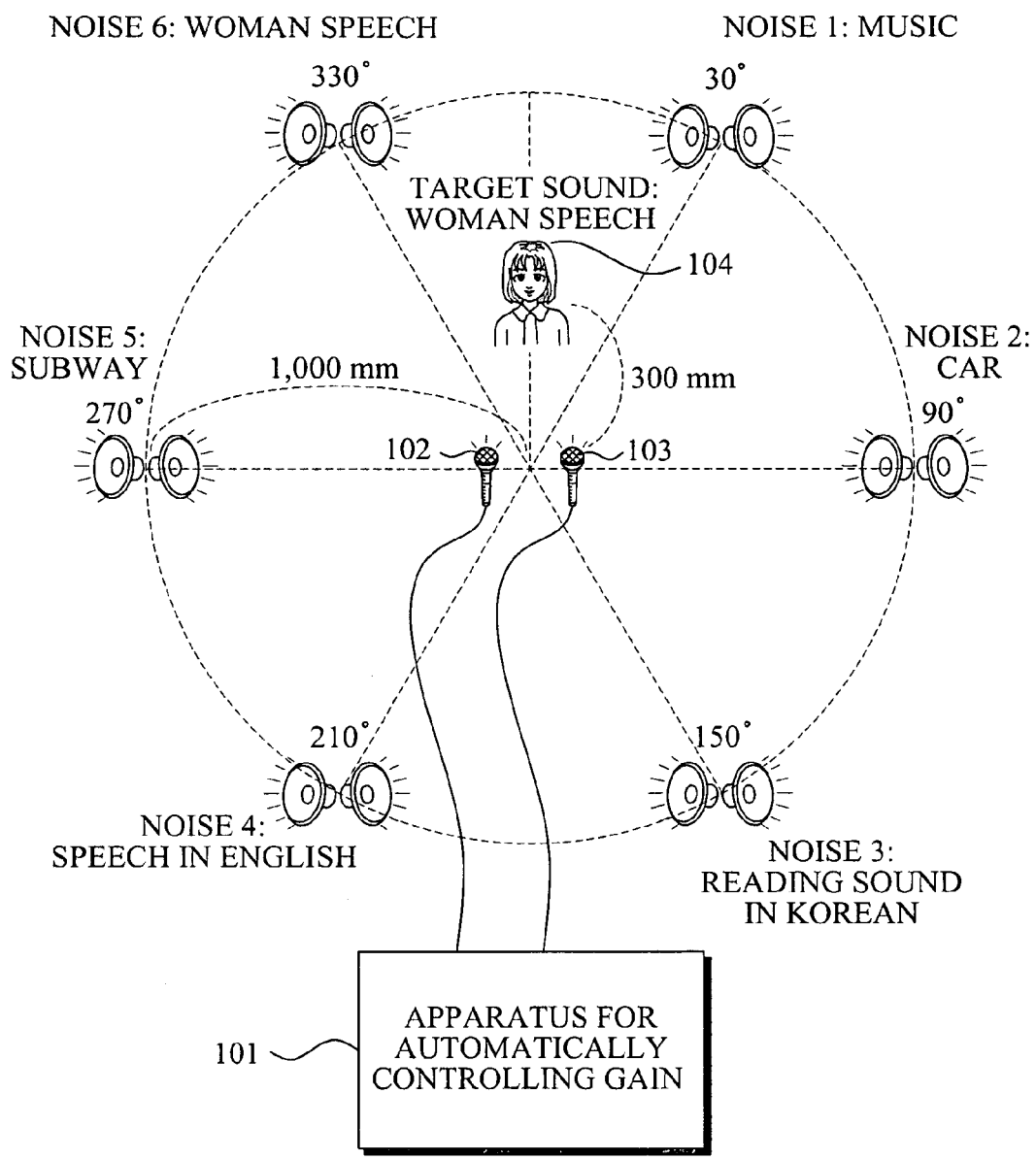
FIG. 1 is a schematic diagram illustrating operations of an apparatus for automatically controlling a gain using phase information according to an exemplary embodiment of the present invention.

Reference will now be made in detail to the embodiments, examples of which are illustrated in the accompanying drawings, wherein like reference numerals refer to the like elements throughout. The embodiments are described below to explain the present invention by referring to the figures.

FIG. 1 is a schematic diagram illustrating operations of an apparatus 101 for automatically controlling a gain using phase information according to an exemplary embodiment of the present invention.

Referring to FIG. 1, the apparatus 101 for automatically controlling gain using phase information may receive input signals with respect to a target sound 104 from each of acoustic input apparatuses 102 and 103. In this instance, the input signals may have a gain difference between themselves. The gain difference may cause problems to predict a direction of the target sound and to extract acoustics of the target sound.

The apparatus 101 for automatically controlling gain using phase information may compensate for the gain difference based on a phase difference between the input signals which are received from the acoustic input apparatuses 102 and 103. Specifically, the apparatus 101 for automatically controlling gain using phase information may extract a predominant target sound component when the input signals include various noise signals as well as the target sound 104, thereby automatically compensating for the gain difference between the input signals based on the predominant target sound component.

In this instance, a signal of the target sound 104 may correspond to speech or noise. Therefore, there is no need to estimate a direction of a target sound 104. This is because the apparatus 101 for automatically controlling gain using phase information is to exclusively extract signal components received from a predetermined specific direction, for example from a direction of 90°, and to compensate for a gain difference between the signals. Therefore, there is no need to search for a direction of a target sound in contrast to conventional methods.

Figure 2:
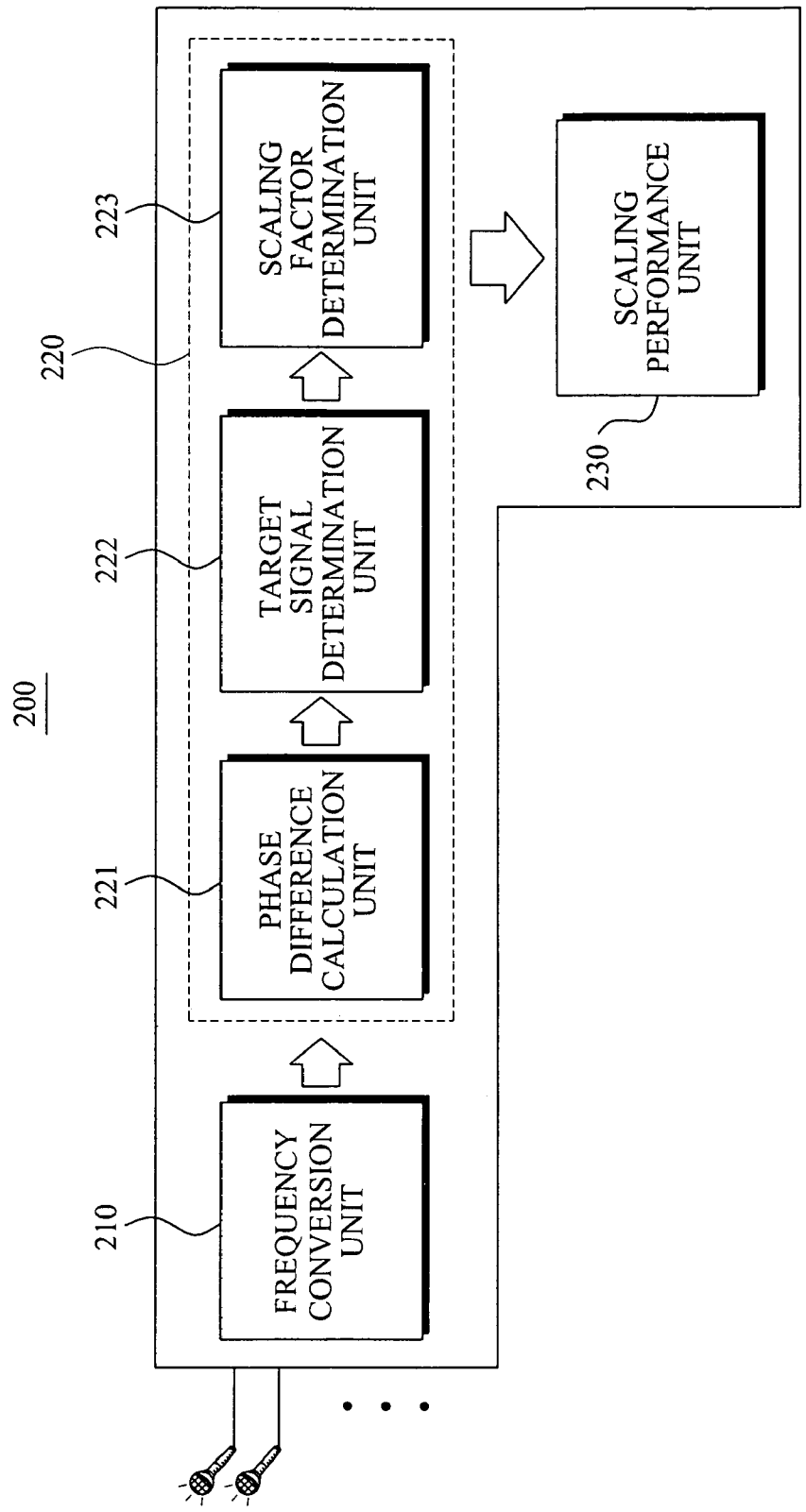
FIG. 2 is a block diagram illustrating an apparatus for automatically controlling a gain using phase information according to an exemplary embodiment of the present invention.

FIG. 2 is a block-diagram illustrating an apparatus for automatically controlling a gain using phase information according to an exemplary embodiment of the present invention.

As illustrated in FIG. 2, the apparatus 200 for automatically controlling gain using phase information may include a frequency conversion unit 210, a factor determination unit 220, and a scaling performance unit 230.

The frequency conversion unit 210 converts each of input signals received from a plurality of acoustic input apparatuses to a frequency input signal.

According to an exemplary embodiment of the present invention, the frequency conversion unit 210 may receive an input signal in a time domain from each of at least two acoustic input apparatuses. Also, the frequency conversion unit 210 may convert the received input signals to frequency input signals. As an example, the frequency conversion unit 210 may convert input signals to frequency input signals according to a Discrete Fourier Transform (DFT) or a fast Fourier transform (FFT). According to the present exemplary embodiment of the present invention, the frequency conversion unit 210 may calculate complex numbers of frequency input signals $X_1(w)$ and $X_2(w)$ being converted from input signals $x_1(t)$ and $x_2(t)$ received from two acoustic input apparatuses, for example as shown below in Equation 1. Also, the factor determination unit 220 may determine phase information of $X_1(w)$, $X_2(w)$ based on each of the complex numbers of the input signals $X_1(w)$ and $X_2(w)$.

$$x_1(t) \xrightarrow{F} X_1(w)$$
$$x_2(t) \xrightarrow{F} X_2(w)$$
$$X_1(w) = a_1(w) + jb_1(w)$$
$$X_2(w) = a_2(w) + jb_2(w)$$

Equation 1

The factor determination unit 220 may determine a scaling factor according to a gain difference between the input signals based on the phase information of the frequency input signals. Specifically, the factor determination unit 220 may calculate a phase difference using phase information of each of the frequency input signals, and determine a frequency target signal corresponding to each of the input signals using the phase difference, thereby determining the scaling factor based on the frequency target signal.

Also, as illustrated in FIG. 2, the factor determination unit 220 may include a phase difference calculation unit 221, a target signal determination unit 222, and a scaling factor determination unit 223.

A phase difference calculation unit 221 may calculate a phase difference between the converted frequency input signals.

As shown below, for example in Equation 2, the phase difference calculation unit 221 may calculate phase information of each of the frequency input signals based on the complex numbers of the frequency signals being converted from the plurality of input signals received from at least two acoustic input apparatuses.

$$X_k(w) = a_k(w) + jb_k(w)$$
$$\angle X_k(w) = \tan^{-1} \frac{b_k(w)}{a_k(w)}$$

Equation 2

Here, $X_k(w)$ indicates frequency input signals which are converted from input signals received from acoustic input apparatuses $k(k=1, 2, \ldots,$ and $M)^{th}$, and $\angle X_k(w)$ indicates phase information of $X_k(w)$.

The phase difference calculation unit 221 may calculate the phase difference based on a phase difference between a plurality of frequency input signals. According to embodiments of the present invention, the phase difference calculation unit 221 may calculate a phase difference ΔP(w) using $\angle X_1(w)$ and $\angle X_2(w)$, where $\angle X_1(w)$ and $\angle X_2(w)$ correspond to phase information of each of the frequency input signals $X_1(w)$ and $X_2(w)$ received from the two acoustic input apparatuses as shown below, for example, in Equation 3.

$$\angle X_1(w) = \tan^{-1}\frac{b_1(w)}{a_1(w)}$$

$$\angle X_2(w) = \tan^{-1}\frac{b_2(w)}{a_2(w)}$$

$$\Delta P(w) = \angle X_1(w) - \angle X_2(w)$$

Equation 3

A target signal determination unit 222 may determine a frequency target signal corresponding to each of the input signals based on the phase difference. Specifically, the target signal determination unit 222 may determine an acoustic direction for each frequency based on the phase difference, and extract a predominant target sound component from the acoustic direction for each frequency, and determine a frequency target signal corresponding to each of the input signals based on the frequency input signals and the predominant target sound component. The target signal determination unit 222 will be described in detail later with reference to FIG. 3.

The scaling factor determination unit 223 may determine a scaling factor according to the gain difference between the input signals based on the frequency target signals.

Specifically, the scaling factor determination unit 223 may determine an amplitude ratio or an energy ratio between the frequency target signals to be the scaling factor according to the gain difference between the input signals. The scaling factor determination unit 223 will be described in detail later with reference to FIG. 5.

The scaling performance unit 230 may perform scaling for gain compensation between the input signals based on the scaling factor.

According to embodiments of the present invention, the scaling performance unit 230 may determine an average scaling factor based on the scaling factor, and perform scaling for gain compensation between the input signals based on a comparison signal and the average scaling factor.

Also, according to the present exemplary embodiment of the present invention, the scaling performance unit 230 may perform scaling for gain compensation between the input signals based on the frequency input signals being converted from the comparison signal and the scaling factor.

That is, the scaling performance unit 230 may perform gain compensation in a time domain based on the input signals in the time domain and the average scaling factor, and output the gain compensated result signal in the time domain, or the scaling performance unit 230 may perform gain compensation in a frequency domain based on the frequency input signals in the frequency domain and the scaling factor, and output the gain compensated result signal in the frequency domain. The scaling performance unit 230 will be described in detail later with reference to FIG. 5 and FIG. 6.

Also, the apparatus 200 for automatically controlling gain using the phase information may perform gain compensation when a gain control mode does not separately exist in acoustic input apparatuses by using a phase difference of difference input signals with fewer calculations, and automatically correspond to a change of characteristics of a microphone as time passes, without a user's intervention.

Also, the apparatus 200 for automatically controlling gain using phase information may combine with a multi-channel noise cancellation algorithm or a beamforming algorithm, which are generally used, thereby providing stabilized performance by performing gain compensation of input signals. Also, the apparatus 200 for automatically controlling gain using phase information may be used to correct a gain difference of sensors for military use, such as radars, as well as devices for receiving acoustics.

Figure 3:
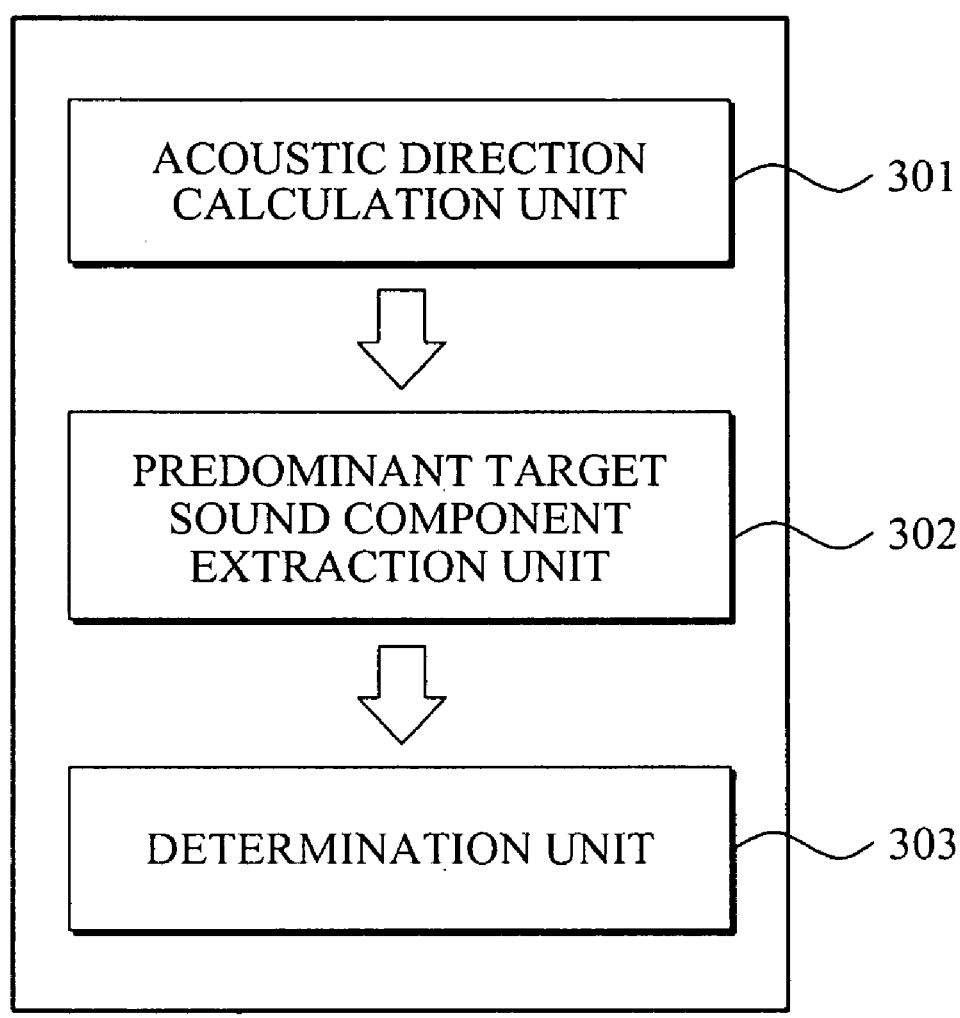
FIG. 3 is a block diagram illustrating a target signal determination unit according to an exemplary embodiment of the present invention.

FIG. 3 is a block-diagram illustrating a target signal determination unit 222 according to an exemplary embodiment of the present invention.

As illustrated in FIG. 3, the target signal determination unit 222 may include an acoustic direction calculation unit 301, a predominant target sound extraction unit 302, and a determination unit 303.

The acoustic direction calculation unit 301 may calculate an acoustic direction for each frequency based on a phase difference.

Specifically, the acoustic direction calculation unit 301 may calculate the acoustic direction for each frequency based on at least one of the phase difference, acoustic speed, a distance of a plurality of acoustic input apparatuses, and angular frequency. In this instance, the acoustic direction calculation unit 301 may use, for example, Equation 4, shown below, having the phase difference to be an input value and having the acoustic direction for each frequency to be a result value, in order to calculate the acoustic direction for each frequency.

$$\theta(w) = \cos^{-1}\left\{\frac{c\Delta P(w)}{wd}\right\}$$

Equation 4

Here, θ(w) indicates an acoustic direction for each frequency, ΔP(w) indicates a phase difference, 'c' indicates acoustic speed, for example 340 m/s, 'd' indicates a distance between acoustic input apparatuses, and w=2πf indicates each frequency.

The predominant target sound component extraction unit 302 may extract a predominant target sound component from the acoustic direction for each frequency.

Specifically, the predominant target sound component extraction unit 302 may extract the predominant target sound component from the acoustic direction for each frequency via a binary filter which is determined to be a target sound direction angle and a target sound coverage angle.

Figure 4:
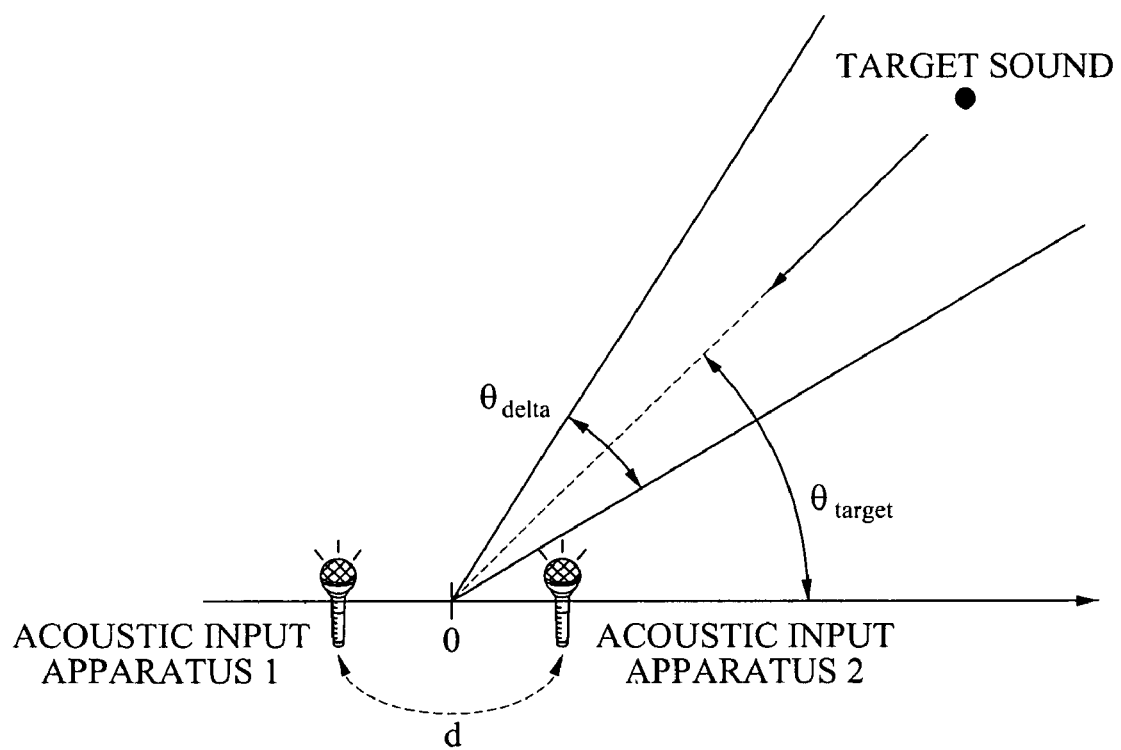
FIG. 4 is a diagram illustrating an example of extracting a predominant target sound component from an acoustic direction for each frequency.

FIG. 4 is a diagram illustrating an example of extracting a predominant target sound component from an acoustic direction for each frequency.

Referring to FIG. 4, the predominant target sound component 302 of FIG. 3 may determine a target sound direction angle $\theta_{target}$ and a target sound coverage angle $\theta_{delta}$ in advance, the target sound direction angle $\theta_{target}$ indicating a direction of a target sound based on the distance 'd' between acoustic input apparatuses 1 and 2, and the target sound coverage angle $\theta_{delta}$ indicating a direction of a target sound. Also, the predominant target sound component extraction unit 302 may extract a predominant target sound component from the acoustic direction for each frequency based on the binary filter including the target sound direction angle and the target sound coverage angle.

As shown, for example in Equation 5 below, the predominant target sound component extraction unit 302 may pass a specific frequency featuring a direction angle through when the direction angle of the specific frequency is within a range of the target sound direction angle $\theta_{target}$ and the target sound coverage angle $\theta_{delta}$ based on the acoustic direction for each frequency, and cancel a value of the direction angle of the specific frequency when the direction angle of the specific frequency is not included in the range of the target sound direction angle $\theta_{target}$ and the target sound coverage $\theta_{angle}$. In this instance, the predominant target sound component 302 may determine $g_1$ to be a constant close in value to '1' and $g_2$ to be a constant close in value to '0' to effectively manage the binary filter. Therefore, the predominant target sound component extraction unit 302 extracts a predominant target sound component in the target sound direction angle $\theta_{target}$ and the target sound coverage angle $\theta_{delta}$ which are previously determined via the binary filter, thereby correcting a gain difference of the input signals even when a noise exists.

$$G(w) = \begin{cases} g_1, & \theta_{target} - \frac{\theta_{delta}}{2} \leq \theta(w) \leq \theta_{target} + \frac{\theta_{delta}}{2} \\ g_2, & \text{otherwise} \end{cases} \quad \text{Equation 5}$$

Here, $\theta(w)$ indicates an acoustic direction for each frequency, $\theta_{target}$ indicates a target sound direction angle, and $\theta_{delta}$ indicates a target sound coverage angle. G(w) indicates a predominant target sound component.

The determination unit 303 of FIG. 3, may determine a frequency target signal corresponding to each of the target signals based on the frequency input signals and the predominant target sound component.

Specifically, referring to Equation 6, for example, the determination unit 303 of FIG. 3 multiplies the frequency input signal being converted from each of the input signals and the predominant target sound component so that the multiplied result is determined to be the frequency target signal corresponding to the each input signal.

$$\tilde{X}_1(w) = X_1(w)G(w) \quad \text{Equation 6:}$$

$$\tilde{X}_2(w) = X_2(w)G(w)$$

Here, $X_1(w)$ and $X_2(w)$ indicate frequency input signals with respect to each of input signals received from a plurality of acoustic input apparatuses, G(w) indicates a predominant target sound component, $\tilde{X}_1(w)$ indicates a frequency target signal which is determined from $X_1(w)$, and $\tilde{X}_2(w)$ indicates a frequency target signal which is determined from $X_2(w)$.

As described above, the apparatus 200 of FIG. 2, for automatically controlling gain using phase information may automatically compensate for a gain difference of input signals based on a predominant target sound component when a target sound is fixed. Also, when the target sound is not fixed and when the target sound does not exist, the apparatus 200 of FIG. 2, for automatically controlling gain using phase information estimates a signal in a predetermined specific direction, thereby compensating for a gain difference between microphones based on the estimated signal. That is, the apparatus 200 of FIG. 2, for automatically controlling gain using phase information may optimally perform gain compensation by estimating a target component in a predetermined direction even when a noise occurs in an unspecified direction or a direction of a target sound is not identified.

Figure 5:
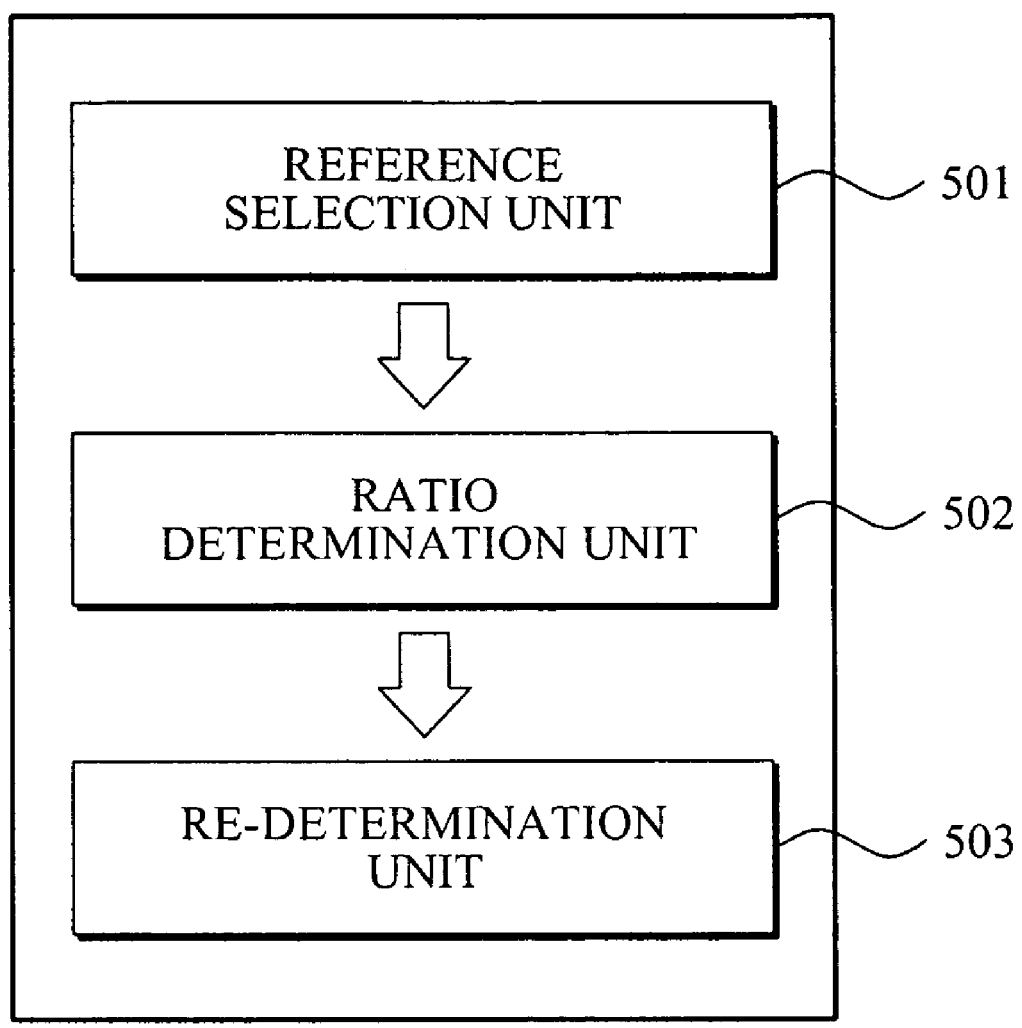
FIG. 5 is a block diagram illustrating a scaling factor determination unit according to an exemplary embodiment of the present invention.

FIG. 5 is a block diagram illustrating a scaling factor determination unit 223 according to an exemplary embodiment of the present invention.

As illustrated in FIG. 5, the scaling factor determination unit 223 may include a reference selection unit 501, a ratio determination unit 502, and a re-determination unit 503.

The reference selection unit 501 may select a reference signal and a comparison signal from input signals.

According embodiments of the present invention, the apparatus 200 of FIG. 2 for automatically controlling gain using phase information determines a reference signal from among input signals being received from at least two acoustic input apparatuses, and compensates for a gain of an input signal except the reference signal for a gain of the reference signal, thereby automatically controlling gains. Therefore, the reference selection unit 501 may select a single input signal from among the at least two input signals, and determine the single input signal except the reference signal to be a comparison signal. As an example, the reference selection unit 501 may determine an input signal $x_1(t)$ of input signals $x_1(t)$ and $x_2(t)$ to be a reference signal, and determine $x_2(t)$ and $x_3(t)$ to be comparison signals.

Hereinafter, embodiments of the present invention will be described by referring to an example where the reference selection unit 501 determines the input signal $x_1(t)$ of input signals $x_1(t)$ and $x_2(t)$ to be the reference signal, and determines $x_2(t)$ and $x_3(t)$ to be the comparison signal. The scope of embodiments of the present invention will not be limited to the two input signals.

The ratio determination unit 502 may determine an amplitude ratio or an energy ratio between a frequency target signal corresponding to the reference signal and a frequency target signal corresponding to the comparison signal to be a scaling factor according to a gain difference between the input signals.

In this instance, as shown below for example in Equation 7, the ratio determination unit 502 may determine a scaling factor of a previous frame to be the scaling factor when the amplitude ratio or energy ratio of the frequency target signal corresponding to the comparison signal is less than a predetermined reference value $E_{th}$, and determine the amplitude ratio or energy ratio between the frequency reference signal and the frequency comparison signal to be the scaling factor when the amplitude or energy of the frequency target signal corresponding to the comparison signal is equal to or greater than the predetermined reference value $E_{th}$. In this instance, the ratio determination unit 502 determines the predetermined reference value $E_{th}$ to be a positive constant value close to the value '0' so that the ratio determination unit 502 may use a result of the previous frame when calculating a scaling factor in the case where an extracted target signal is extremely small or does not exist. Therefore, a division of the size of the frequency comparison signal by 0 may be prevented.

$$SF(w) = SF(w, \tau) = \begin{cases} SF(w, \tau-1), & \text{if } |\tilde{X}_2(w)| < E_{th} \\ |\tilde{X}_1(w)|/|\tilde{X}_2(w)|, & \text{otherwise} \end{cases} \quad \text{Equation 7}$$

Here, SF(w) indicates a determined scaling factor, SF(w,τ) indicates a scaling factor of a current frame, SF(w,τ−1) indicates a scaling factor of a previous frame, $E_{th}$ indicates a predetermined reference value, $\tilde{X}_1(w)$ indicates a frequency target signal corresponding to a reference signal $x_1(t)$, and $\tilde{X}_2(w)$ indicates a frequency target signal corresponding to $x_2(t)$. Specifically, as described above, $\tilde{X}_1(w)$ indicates a frequency target signal which is determined from the frequency input signal $x_1(w)$ being converted from an input signal $x_1(t)$, and $\tilde{X}_2(w)$ indicates a frequency target signal which is determined from a frequency input signal $X_2(w)$ being converted from an input signal $x_2(t)$.

The re-determination unit 503 may re-determine a scaling factor based on the scaling factor, the scaling factor of the previous frame, and a determination factor.

Specifically, the re-determination unit 503 re-determines a scaling factor of a current frame via Equation 8, for example, as shown below. Equation 8 is based on the scaling factor, the scaling factor of the previous frame, and a determination factor to prevent a rapid gain change over time. In this instance, the scaling factor of the current frame may indicate a scaling factor which is determined in the ratio determination unit 502.

$$SF(w) = \alpha \cdot SF(w,\tau) + (1-\alpha) SF(w, \tau-1) \quad \text{Equation 8:}$$

Here, $SF(w,\tau)$ indicates a scaling factor of a current frame which is determined in the ratio determination unit 502, $SF(w, \tau-1)$ indicates a scaling factor of a previous frame, $SF(w)$ indicates a re-determined scaling factor, and $\alpha$ indicates a determination factor.

Figure 6:
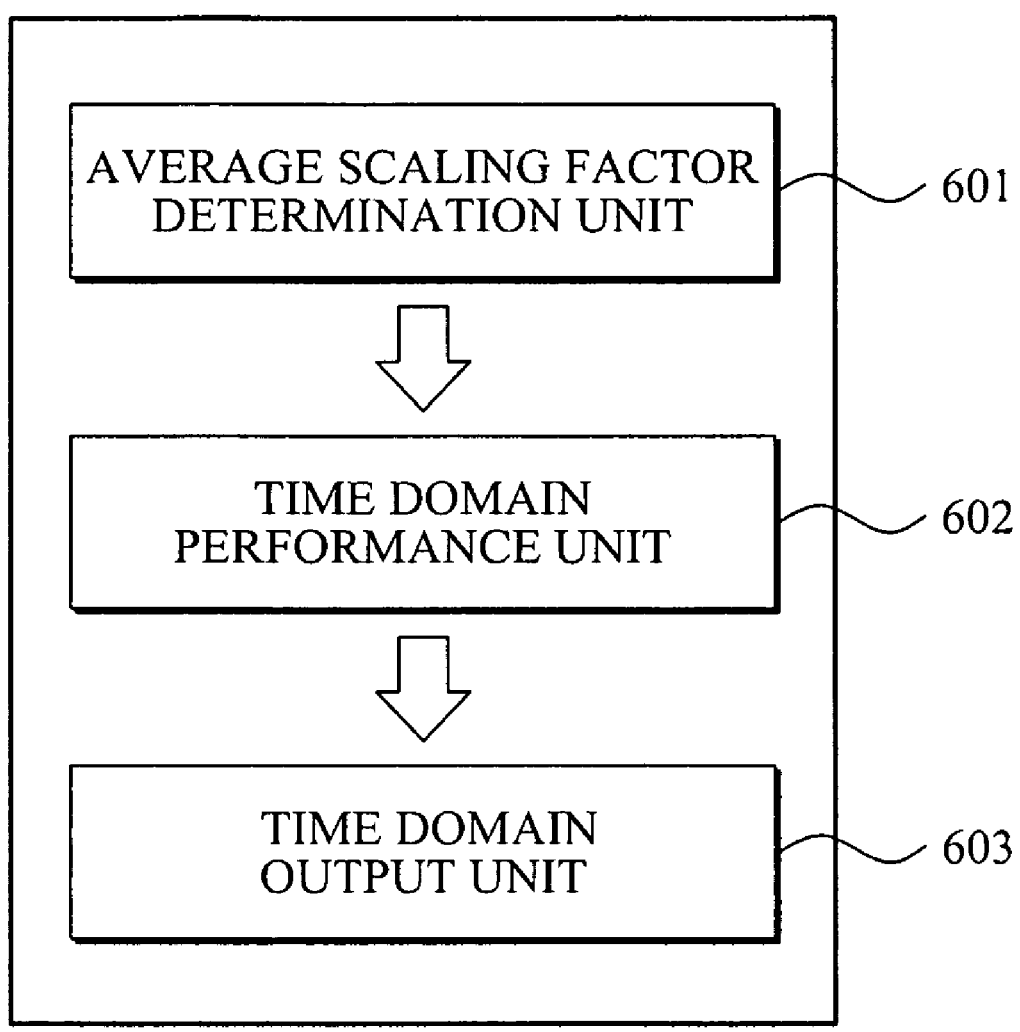
FIG. 6 is a block diagram illustrating a scaling performance unit according to an exemplary embodiment of the present invention.

FIG. 6 is a block diagram illustrating a scaling performance unit 230 according to an exemplary embodiment of the present invention.

Referring to FIG. 6, the scaling performance unit 230 may include an average scaling factor determination unit 601, a time domain performance unit 602, and a time domain output unit 603.

The average scaling factor determination unit 601 may determine an average scaling factor based on a scaling factor. For instance, the average scaling factor determination unit 601 may determine an average scaling factor for each analysis frame based on the scaling factor.

Specifically, the average scaling factor determination unit 601, to perform scaling with respect to input signals in a time domain, may determine an average scaling factor for all frequencies based on the scaling factor being determined for each analysis frame as shown below, for example, in Equation 9. In this instance, the scaling factor may be any one of scaling factors which are determined in the ratio determination unit 502 of FIG. 5 or the re-determination unit 503.

$$TotalSF = \text{average}(SF(w)) \quad \text{Equation 9}$$
$$= \frac{1}{N_w} \sum_{all\ w} SF(w)$$

Here, TotalSF indicates an average scaling factor, and SF(w) indicates a determined scaling factor or a re-determined scaling factor.

Also, according to embodiments of the present invention, the average scaling factor determination unit 601 may determine an average scaling factor based on the scaling factor, and re-determine an average scaling factor based on the determined average scaling factor, an average scaling factor of a previous frame, and a determination factor.

Specifically, referring to Equation 10 below, for example, the average scaling factor determination unit 601, in order to prevent a rapid change of an average scaling factor over time, may determine an average scaling factor based on the scaling factor using Equation 9, and re-determine an average scaling factor of a current frame based on the average scaling factor, an average scaling factor of a previous frame, and a determination factor. In this instance, the average scaling factor of the current frame may indicate a re-determined scaling factor.

That is, an average scaling factor which is initially determined using Equation 9 may be updated via Equation 10.

$$TotalSF(\tau) = \beta \cdot \frac{1}{N_w} \sum_{all\ w} SF(w) + (1-\beta) \times TotalSF(\tau-1) \quad \text{Equation 10}$$

Here, $TotalSF(\tau)$ indicates a scaling factor of a current frame, and $TotalSF(\tau-1)$ indicates a scaling factor of a previous frame.

The time domain performance unit 602 may perform scaling for gain compensation between input signals based on the comparison signal and the average scaling factor.

Specifically, the time domain performance unit 602 multiplies the comparison signal and the average scaling factor, thereby compensating for a gain difference between the comparison signal and the reference signal.

The input signal $x_1(t)$ being selected to be the reference signal in the reference selection unit 501 and the comparison signal $x_2(t)$ may have a gain difference as large as the average scaling factor. Therefore, the time domain performance unit 602 multiplies the comparison signal and the average scaling factor, thereby compensating for the gain difference between the comparison signal and the reference signal. In this instance, the comparison signal and the reference signal are signals in a time domain, and the average scaling factor is determined for gain compensation in the time domain.

Referring to Equation 11 below, for example, the time domain performance unit 602 performs the gain compensation, thereby generating a reference output signal corresponding to the reference signal $x_1(t)$ and a comparison output signal corresponding to the comparison signal $x_2(t)$. Also, the time domain output unit 603 may output the input signal being generated after performing the scaling for gain compensation. That is, the time domain output unit 603 may output the reference output signal and the comparison output signal.

Although, here it is described that the number of input signals is two,, embodiments of the present invention include the time domain performance unit 602 comparing, one by one, the reference signal being selected from the at least two input signals with each comparison signal from the input signals except the reference signal, thereby performing gain compensation with respect to all of the at least two input signals. Also, the time domain output unit 603 may output at least two input signals being generated after performing the scaling for gain compensation.

$$x'_1(t) = x_1(t) \quad \text{Equation 11:}$$
$$x'_2(t) = TotalSF \times x_2(t)$$

Here, $x_1(t)$ indicates a reference signal, $x_2(t)$ indicates a comparison signal, $x'_1(t)$ indicates a reference output signal, $x'_2(t)$ indicates a comparison output signal, and TotalSF indicates an average scaling factor.

Figure 7:
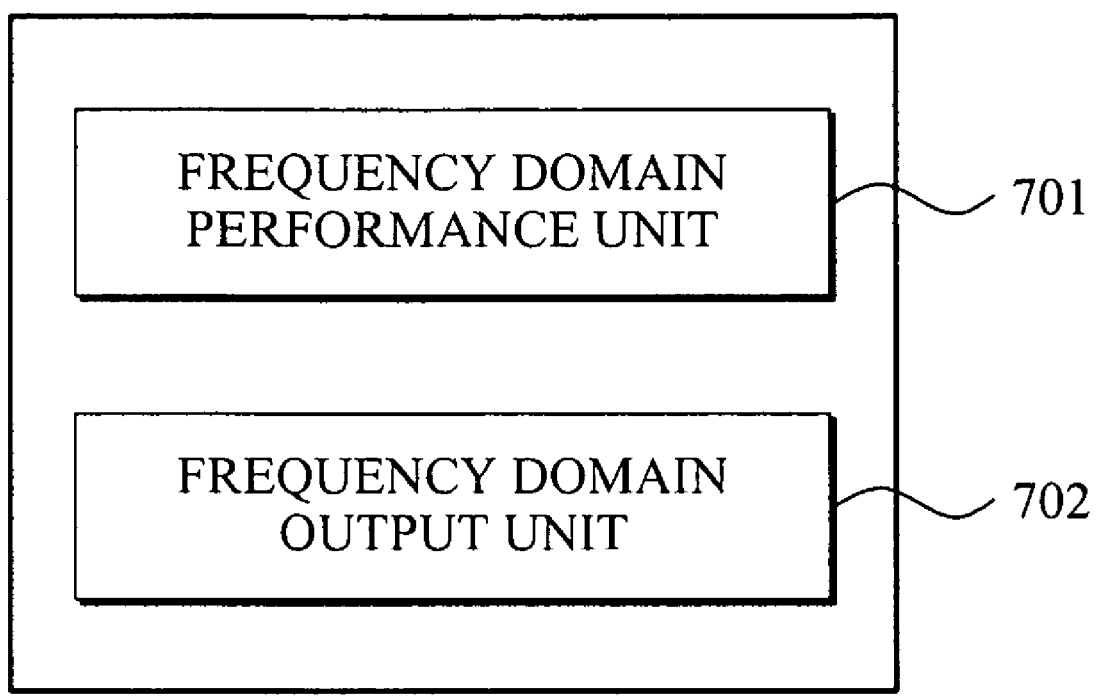
FIG. 7 is a block diagram illustrating a scaling performance unit according to another exemplary embodiment of the present invention.

FIG. 7 is a block diagram illustrating a scaling performance unit 230 according to another exemplary embodiment of the present invention.

The scaling performance unit 230 may include a frequency domain performance unit 701 and a frequency domain output unit 702.

The frequency domain performance unit 701 may perform scaling for gain compensation between input signals based on the frequency input signal being converted from the comparison signal and the scaling factor. That is, the frequency domain performance unit 701 multiplies the frequency input signal being converted from the comparison signal and the scaling factor, thereby compensating for a gain difference between the frequency input signal being converted from the reference signal and the frequency input signal being converted from the comparison signal.

The input signals $x_1(t)$ being selected to be the reference signal in the reference selection unit 501 of FIG. 5 and the comparison signal $x_2(t)$ may have a gain difference as large as the average scaling factor. Also, the frequency input signals $X_1(w)$ and $X_2(w)$ being converted from each of the $x_1(t)$ and $x_2(t)$ in the frequency conversion unit 210 may have a gain difference as great as the scaling factor. In this instance, the frequency domain performance unit 701 may perform scaling for gain compensation between the frequency input signals $X_1(w)$ and $X_2(w)$ based on the scaling factor. Also, each of the frequency input signals is a signal in a time domain, and the scaling factor may be used for gain compensation in a frequency domain. Also, the scaling factor may be any one of scaling factors being determined in the ratio determination unit 502 or the re-determination unit 503 of FIG. 5.

Referring to Equation 12 below, for example, the frequency domain performance unit 701 may perform gain compensation in a frequency domain, and generate a reference output signal in the frequency domain and a comparison output signal in the frequency domain, the reference output signal in the frequency domain corresponding to the frequency input signal $X_1(w)$ which is converted from the reference signal, and the comparison output signal in the frequency domain corresponding to the frequency input signal $X_2(w)$ which is converted from the comparison signal. Also, the frequency domain output unit 702 may output a frequency input signal being converted from the reference signal and a frequency input signal being generated after the scaling factor is multiplied. That is, the frequency domain output unit 702 may output the reference output signal in the frequency domain and the comparison output signal in the frequency domain.

Here, it is described that the number of input signals is two, however embodiments of the present invention include the frequency domain performance unit 701 comparing, one by one, the frequency input signal being converted from the reference value which is selected from the at least two input signals with the frequency input signal being converted from each of the comparison signals except the reference signal, thereby performing gain compensation with respect to all of the at least two input signals. The frequency domain output unit 702 may output a frequency input signal being generated after the frequency input signal, being converted from the reference signal, and the scaling factor are multiplied $$X'_1(w)=X_1(w)$$

$$X'_2(w)=X_2(w)SF(w)$$

Equation 12:

Here, $X_1(t)$ indicates a frequency input signal being converted from a reference signal, $X_2(t)$ indicates a frequency input signal being converted from a comparison signal, $X'_1(t)$ indicates a reference output signal in a frequency domain, $X'_2(t)$ indicates a comparison output signal in the frequency domain, and $SF(w)$ indicates a scaling factor.

Figure 8:
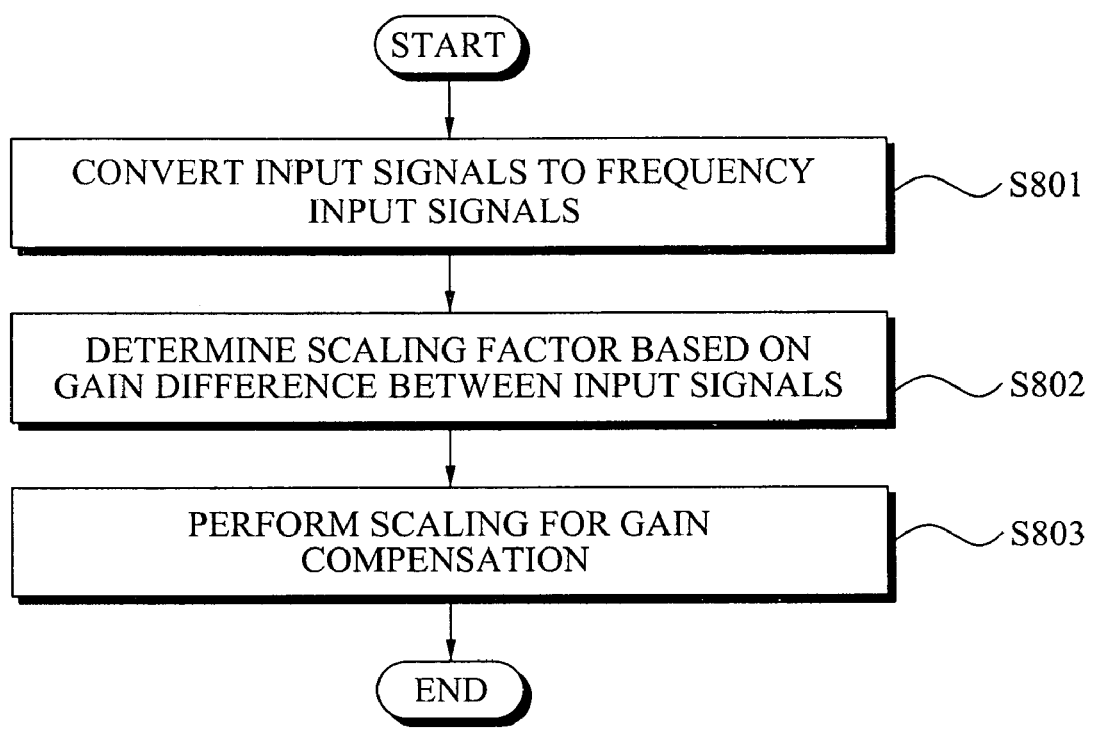
FIG. 8 is a flowchart illustrating a method for automatically controlling a gain using phase information according to exemplary embodiment of the present invention.

FIG. 8 is a flowchart illustrating a method for automatically controlling a gain using phase information according to exemplary embodiment of the present invention.

As illustrated in FIG. 8, the method for automatically controlling gain using phase information may include operations S801 through S803. Also, the method for automatically controlling gain using phase information may be performed in an apparatus for automatically controlling a gain using phase information.

In operation S801, the apparatus for automatically controlling gain using phase information may convert each of input signals being received from a plurality of an acoustic input apparatuses to frequency signals.

In operation S802, the apparatus for automatically controlling gain using phase information may determine a scaling factor based on a phase difference of the frequency input signals.

Specifically, the apparatus for automatically controlling gain using phase information calculates a phase difference between the converted frequency input signals, may determine a frequency target signal corresponding to each of the input signals based on the phase difference, thereby determining the scaling factor according to a gain difference between the input signals.

In operation S803, the apparatus for automatically controlling gain using phase information may perform scaling for gain compensation based on the scaling factor. Regarding FIG. 8, any undescribed contents may be substantially the same as the above described operations of the apparatus for automatically controlling gain using phase information in FIGS. 2 through 7, or easily inferred by a person having an ordinary skill in the art.

The method for automatically controlling gain using phase information according to the above-described embodiments of the present invention may be recorded in computer-readable media including program instructions to implement various operations embodied by a computer. The media may also include, alone or in combination with the program instructions, data files, data structures, and the like. Examples of computer-readable media include magnetic media such as hard disks, floppy disks, and magnetic tape; optical media such as CD ROM disks and DVD; magneto-optical media such as optical disks; and hardware devices that are specially configured to store and perform program instructions, such as read-only memory (ROM), random access memory (RAM), flash memory, and the like. Examples of program instructions include both machine code, such as produced by a compiler, and files containing higher level code that may be executed by the computer using an interpreter. The described hardware devices may be configured to act as one or more software modules in order to perform the operations of the above-described embodiments of the present invention.

Although a few embodiments have been shown and described, it would be appreciated by those skilled in the art that changes may be made in these embodiments without departing from the principles and spirit of the invention, the scope of which is defined in the claims and their equivalents.

What is claimed is:

1. An apparatus for automatically controlling a gain using phase information, the apparatus comprising:
    a frequency conversion unit to convert each of a plurality of input signals received from a plurality of acoustic input apparatuses to frequency input signals;
    a factor determination unit to determine a scaling factor, the scaling factor being determined using a phase difference between each of the frequency input signals; and
    a scaling performance unit to perform scaling for gain compensation between the input signals based on the scaling factor.

2. The apparatus of claim 1, wherein the factor determination unit comprises:
    a phase difference calculation unit to calculate a phase difference between the frequency input signals;

a target signal determination unit to determine frequency target signals corresponding to each of the input signals based on the phase difference; and a scaling factor determination unit to determine a scaling factor, according to the gain difference between the input signals, based on the frequency target signals.

3. The apparatus of claim 2, wherein the target signal determination unit comprises:

an acoustic direction calculation unit to calculate an acoustic direction based on the phase difference;

a predominant target sound component extraction unit to extract a predominant target sound component based on the acoustic direction; and a determination unit to determine frequency target signals corresponding to each of the input signals based on the frequency input signals and the predominant target sound component.

4. The apparatus of claim 3, wherein the acoustic direction calculation unit calculates the acoustic direction based on at least one of the phase difference, acoustic speed, a distance of the plurality of acoustic input apparatuses, and an angular frequency.

5. The apparatus of claim 3, wherein the predominant target sound component extraction unit extracts the predominant target sound component from the acoustic direction via a binary filter which is determined to be a target sound direction angle and a target sound coverage angle.

6. The apparatus of claim 3, wherein the determination unit multiplies the frequency input signal converted from each of the input signals and the predominant target sound component so that the multiplied result is determined to be the frequency target signal corresponding to each of the input signals.

7. The apparatus of claim 2, wherein the scaling factor determination unit determines an amplitude ratio or an energy ratio between the frequency target signals to be the scaling factor.

8. The apparatus of claim 2, wherein the scaling factor determination unit comprises:

a reference selection unit to select a reference signal and a comparison signal from the input signals; and a ratio determination unit to determine an amplitude ratio or an energy ratio between a frequency target signal corresponding to the reference signal and a frequency target signal corresponding to the comparison signal to be the scaling factor.

9. An apparatus for automatically controlling a gain using phase information, the apparatus comprising:

a frequency conversion unit to convert each of a plurality of input signals received from a plurality of acoustic input apparatuses to frequency input signals;

a factor determination unit to determine a scaling factor, according to a gain difference between the input signals, based on a phase difference of the frequency input signals; and a scaling performance unit to perform scaling for gain compensation between the input signals based on the scaling factor, wherein the factor determination unit comprises:

a phase difference calculation unit to calculate a phase difference between the frequency input signals;

a target signal determination unit to determine frequency target signals corresponding to each of the input signals based on the phase difference; and a scaling factor determination unit to determine a scaling factor, according to the gain difference between the input signals, based on the frequency target signals, wherein the scaling factor determination unit comprises:

a reference selection unit to select a reference signal and a comparison signal from the input signals; and a ratio determination unit to determine an amplitude ratio or an energy ratio between a frequency target signal corresponding to the reference signal and a frequency target signal corresponding to the comparison signal to be the scaling factor, and wherein the ratio determination unit determines a scaling factor of a previous frame to be the scaling factor when an amplitude or an energy of the frequency target signal corresponding to the comparison signal is smaller than a reference value, and determines an amplitude ratio or an energy ratio between the frequency target signal corresponding to the reference signal and the frequency target signal corresponding to the comparison signal to be the scaling factor when the amplitude or the energy of the frequency target signal corresponding to the comparison signal is equal to or larger than the reference value.

10. The apparatus of claim 8, wherein the scaling factor determination unit re-determines a scaling factor based on the scaling factor, the scaling factor of the previous frame, and a determination factor.

11. The apparatus of claim 8, wherein the scaling performance unit comprises:

an average scaling factor determination unit to determine an average scaling factor based on the scaling factor; and a time domain unit performing to scale for gain compensation between the input signals based on the comparison signal and the average scaling factor.

12. The apparatus of claim 11, wherein the average scaling factor determination unit determines the average scaling factor based on the scaling factor, and re-determines an average scaling factor based on the determined average scaling factor, the average scaling factor of a previous frame, and a determination factor.

13. The apparatus of claim 11, wherein the average scaling factor determination unit determines an average scaling factor for each analysis frame based on the scaling factor, and the time domain unit multiplies the comparison signal and the average scaling factor so that a gain difference between the reference signal and the comparison signal is compensated.

14. The apparatus of claim 11, wherein the scaling performance unit further comprises:

a time domain output unit to output the gain compensated input signals.

15. The apparatus of claim 8, wherein the scaling performance unit comprises:

a frequency domain performance unit to perform scaling for gain compensation between the input signals, based on a frequency input signal being converted from the comparison signal, and the scaling factor.

16. The apparatus of claim 15, wherein the scaling performance unit multiplies the frequency input signal being converted from the comparison signal and the scaling factor so that the gain difference between a frequency input signal being converted from the reference signal and the frequency input signal being converted from the comparison signal is compensated.

17. The apparatus of claim 16, wherein the scaling performance unit further comprises:

a frequency domain output unit to output the frequency input signal, the frequency input signal being generated by multiplying the frequency input signal being converted from the comparison signal and the scaling factor, and the frequency input signal being converted from the reference signal.

18. An apparatus for automatically controlling a gain using phase information, the apparatus comprising:
a frequency conversion unit to convert each of a plurality of input signals received from a plurality of acoustic input apparatuses to frequency input signals;
a factor determination unit to determine a scaling factor, the scaling factor being determined by determining an amplitude ratio or an energy ratio between frequency target signals of the frequency input signals; and
a scaling performance unit to perform scaling for gain compensation between the input signals based on the determined scaling factor.

* * * * *